(12) United States Patent
Mehrotra et al.

(10) Patent No.: US 7,279,397 B2
(45) Date of Patent: Oct. 9, 2007

(54) SHALLOW TRENCH ISOLATION METHOD (75) Inventors: Manoj Mehrotra, Plano, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 311 days.

(21) Appl. No.: 10/899,663

(22) Filed: Jul. 27, 2004

(65) Prior Publication Data
US 2006/0024909 A1 Feb. 2, 2006

(51) Int. Cl.
*H01L 21/76* (2006.01)
(52) U.S. Cl. ............... 438/433; 438/424; 257/E21.551; 257/E21.54
(58) Field of Classification Search ........ 438/424–438; 257/E21.54, E21.545, E21.546, E21.551
See application file for complete search history.

(56) References Cited

U.S. PATENT DOCUMENTS

| | | | |
|---|---|---|---|
| 5,719,085 A | 2/1998 | Moon et al. | |
| 5,780,353 A * | 7/1998 | Omid-Zohoor | 438/433 |
| 5,807,789 A | 9/1998 | Chen et al. | |
| 5,830,796 A * | 11/1998 | Lee | 438/296 |
| 5,863,827 A | 1/1999 | Joyner | |
| 5,937,309 A | 8/1999 | Chuang | |
| 5,956,598 A | 9/1999 | Huang et al. | |
| 5,960,276 A | 9/1999 | Liaw et al. | |
| 6,040,232 A | 3/2000 | Gau | |
| 6,180,490 B1 | 1/2001 | Vassiliev et al. | |
| 6,225,187 B1 | 5/2001 | Huang et al. | |
| 6,245,639 B1 | 6/2001 | Tsai et al. | |
| 6,472,254 B2 * | 10/2002 | Cantarini et al. | 438/138 |
| 6,524,930 B1 * | 2/2003 | Wasshuber et al. | 438/424 |
| 6,562,675 B1 | 5/2003 | Watt | |
| 6,569,750 B2 * | 5/2003 | Kim et al. | 438/524 |
| 6,576,558 B1 | 6/2003 | Lin et al. | |
| 6,649,461 B1 | 11/2003 | Lai et al. | |
| 6,667,224 B1 | 12/2003 | Watt et al. | |

(Continued)

FOREIGN PATENT DOCUMENTS

WO  WO 2004017417 A1 *  2/2004

OTHER PUBLICATIONS

U.S. Appl. No. 10/899,664, filed Jul. 27, 2004, Chatterjee et al.

(Continued)

*Primary Examiner*—B. William Baumeister
*Assistant Examiner*—Matthew W. Such
(74) *Attorney, Agent, or Firm*—Peter K. McLarty; W. James Brady, III; Frederick J. Telecky, Jr.

(57) ABSTRACT

A method (200) of forming an isolation structure is presented, in which a hard mask layer (304, 308) is formed (204, 206) over the isolation and active regions (305, 303) of a semiconductor body (306), and a dopant is selectively provided to a portion of the active region (303) proximate the isolation region (305) to create a threshold voltage compensation region (318). After the compensation region (318) is created, the hard mask layer (304, 308) is patterned (218) to create a patterned hard mask. The patterned hard mask is then used in forming (222) a trench (323) in the isolation region (305) near the compensation region (318), and the trench (323) is then filled (224) with a dielectric material (338).

6 Claims, 9 Drawing Sheets

U.S. PATENT DOCUMENTS

| | | |
|---|---|---|
| 6,717,231 B2 | 4/2004 | Kim et al. |
| 6,740,944 B1 | 5/2004 | McElheny et al. |
| 7,045,410 B2 * | 5/2006 | Mehrad et al. ............. 438/217 |
| 2001/0018252 A1 * | 8/2001 | Park et al. .................. 438/286 |
| 2002/0190314 A1 * | 12/2002 | Kuwazawa ................. 257/336 |
| 2003/0181004 A1 | 9/2003 | Watt |
| 2004/0108540 A1 * | 6/2004 | Yoshino .................... 257/315 |
| 2004/0126936 A1 * | 7/2004 | Sohn .......................... 438/142 |
| 2004/0157403 A1 * | 8/2004 | Han et al. ................... 438/424 |
| 2006/0211264 A1 * | 9/2006 | Katoschke et al. ......... 438/778 |

OTHER PUBLICATIONS

U.S. Appl. No. 10/899,844, filed Jul. 27, 2004, Mehrad et al.

* cited by examiner

SHALLOW TRENCH ISOLATION METHOD

FIELD OF INVENTION

The present invention relates generally to semiconductor devices and more particularly to methods for forming shallow trench isolation structures in the manufacture of semiconductor devices.

BACKGROUND OF THE INVENTION

Figure 1:
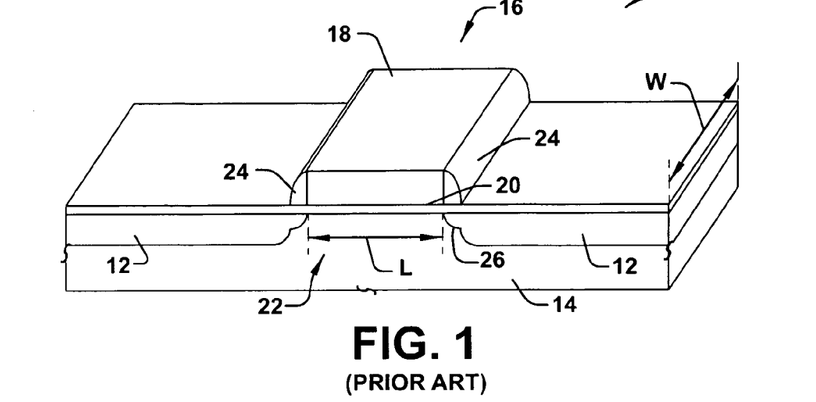
FIG. 1 is a prior art fragmentary perspective view of a MOS transistor.

In the area of semiconductor device fabrication, the MOS transistor is a basic building block, wherein the transistor can be controlled to operate either in a digital or analog manner. In the fabrication of MOS transistors, source and drain regions are doped oppositely to that of a body region in a semiconductor substrate. For example, as illustrated in prior art FIG. 1, source/drain regions 12 are formed in a semiconductor body 14 of a MOS transistor, wherein the source/drain regions 12 are an n-type material and the body region 14 is a p-type material (an NMOS transistor). A gate structure 16, for example, a polysilicon gate electrode 18 overlying a gate dielectric 20, overlies a channel region 22 of the semiconductor body. Sidewall spacers 24 reside on lateral edges of the gate structure 16 to facilitate the spacing of extension regions 26 associated with the source/drains 12. Based on the gate structure 16, a distance between the source/drain regions 12 is defined, which is often referred to as a channel length "L", while a depth of the transistor, or extent in which the transistor extends transverse to the channel, is often referred to as a width "W" of the device. The width-to-length ratio (W/L) is a factor that substantially influences the drive current of the device, as well as other device performance characteristics.

As transistor devices constantly get scaled down to improve device density, both the width "W" and the channel length "L" dimensions are reduced, giving rise to various fabrication and device performance issues. One problem associated with a reduction in the transistor width "W" is experienced when shallow trench isolation (STI) is employed for device isolation, and that problem is sometimes referred to as the inverse narrow width effect (INWE). The mechanisms by which the INWE arises are not fully understood, however, various hypotheses exist. For example, it is postulated that the INWE is related to fields generated by transistors that are concentrated at sharp corners between the semiconductor body and the trench isolation structures. In addition, or alternatively, the INWE may be influenced by the diffusion of dopant atoms from the semiconductor body into the isolation structures, thereby reducing the dopant concentration of the channel dopant regions of the transistor near the STI structure.

Figure 2:
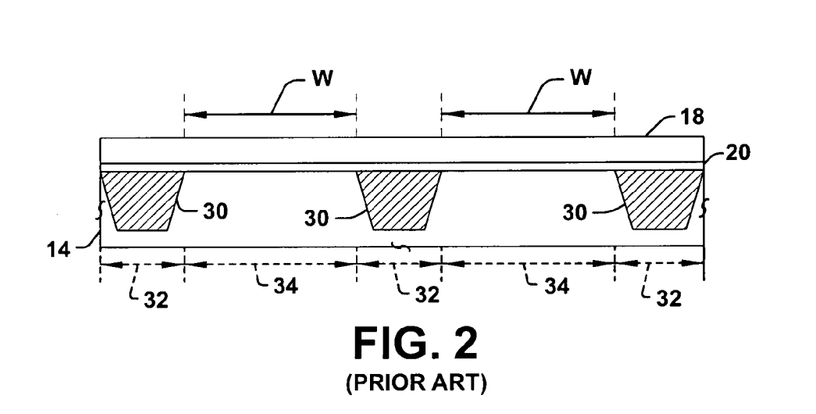
FIGS. 2 and 3 are prior art partial side elevation views in section illustrating a portion of a MOS transistor in various points in a manufacturing process that experiences the inverse narrow width effect (INWE)

Referring to prior art FIG. 2, a portion of a partially fabricated semiconductor device is illustrated, wherein a plurality of isolation structures 30, or STI trenches, are formed in the semiconductor body 14, thereby separating the body into isolation regions 32 and active areas 34, respectively. Subsequently, transistor devices such as MOS transistors are formed in the active areas 34, wherein a width dimension "W" of the MOS transistors extends between the isolation structures 30 as illustrated. As MOS transistor scaling continues, the distance "W" between the isolation structures decreases.

Figure 3:
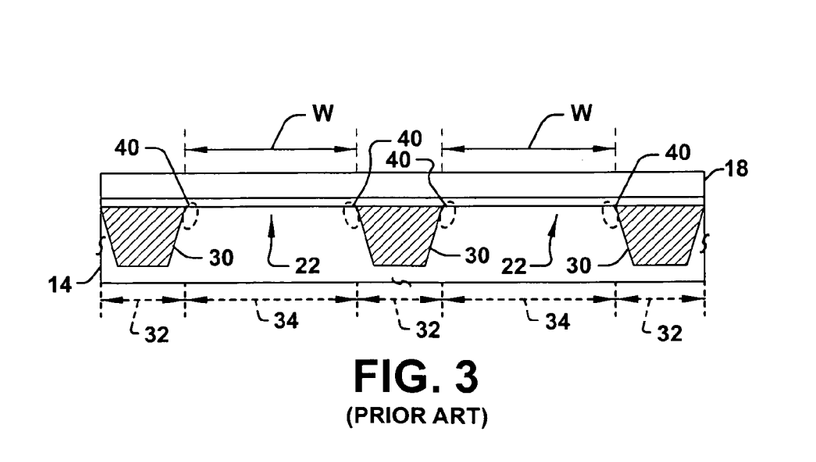

As illustrated in prior art FIG. 3, after source/drain regions and a gate electrode 18 are formed in the active areas, portions 40 of the active regions that underlie the gate 18 in the channel near the STI trenches 30 will tend to suffer from the INWE. In such instances, when the gate is biased, the field lines that form at the overlapping gate electrode 18 are focused by the edge geometry of the channel, and therefore at the edges of the channel, and an inversion layer is formed at lower voltages than at the center portion of the device in the middle of the active area. Consequently, less bias is needed for application to the gate to invert the channel across its full width, thereby lowering the threshold voltage of the device. With a decrease in threshold voltage, sub-threshold leakage may undesirably increase.

Figure 4:
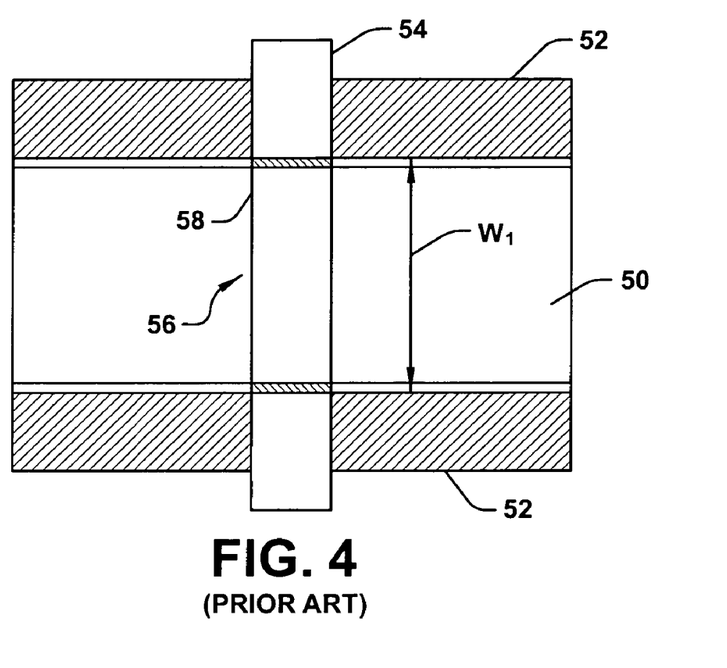
FIGS. 4 and 5 are prior art partial side elevation views in section illustrating a MOS transistor and how, as a transistor dimension decreases in a width direction, the INWE becomes more pronounced.
Figure 5:
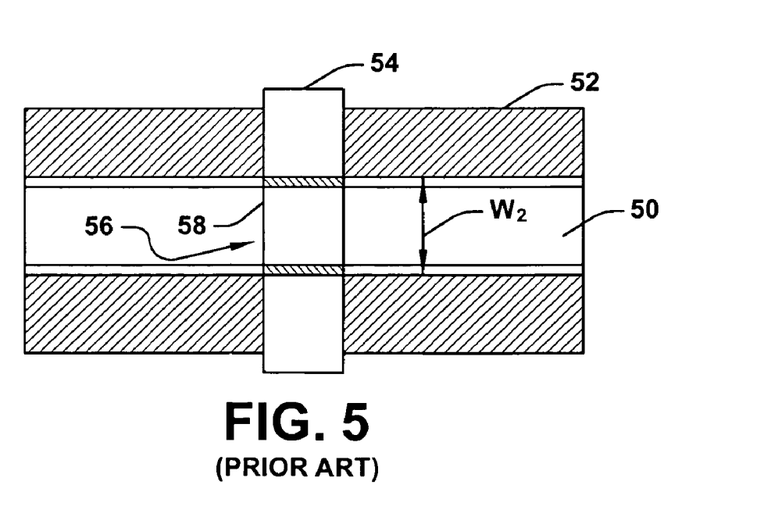
Figure 6:
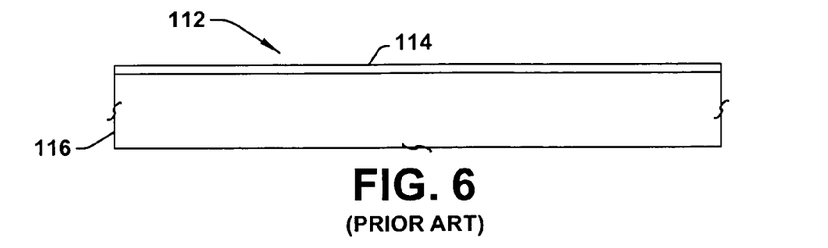
FIGS. 6-12 are prior art partial side elevation views in section illustrating a conventional shallow trench isolation process for providing isolation between active areas in a semiconductor device.
Figure 7:
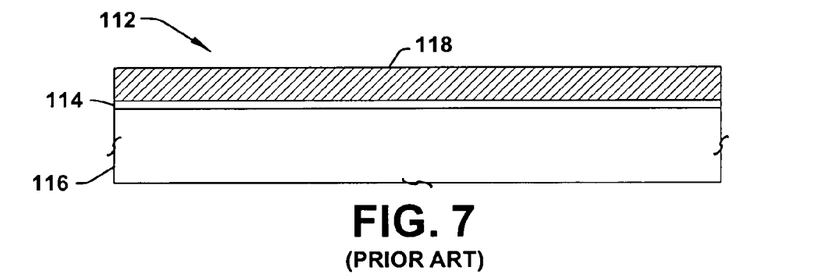
Figure 8:
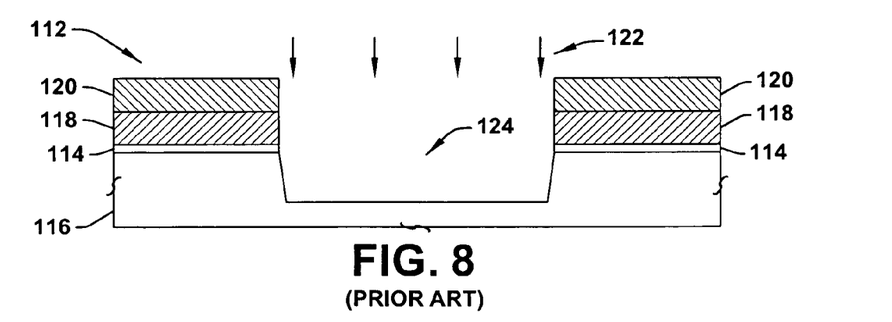
Figure 9:
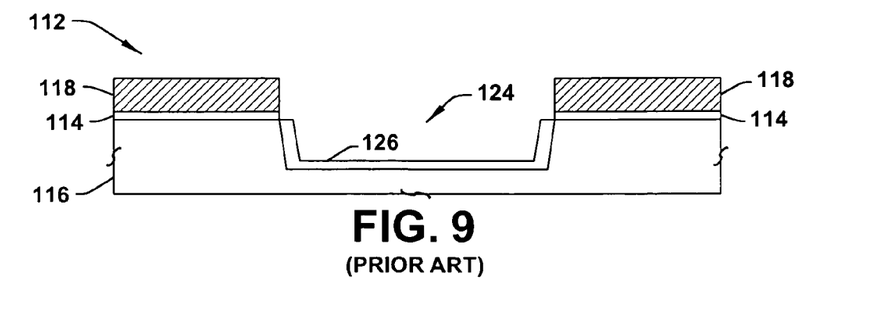

At large transistor widths "W" the above effect does not greatly influence the device performance, however, as "W" continues to scale downward, the impact of INWE is greater. For example, as illustrated in prior art FIGS. 4 and 5, a plan view of two portions of a MOS transistor are provided, wherein the two devices have differing transistors widths. For example, in prior art FIG. 4, an active area 50 is defined between two laterally extending STI isolation regions 52. A conductive gate electrode 54 extends vertically across the active area between the two isolation regions 52, thereby defining a channel region 56 thereunder in the active area. Due to the INWE, a region 58 exists under the channel near the STI that contributes to a reduced device threshold voltage. For a device width W1, the net impact of the region 58 due to the INWE is relatively insignificant, however, as illustrated in prior art FIG. 5, for smaller transistor widths W2, the INWE will have a substantially greater impact on the resulting device performance.

Therefore there remains a need in the art for improved STI processes and techniques that reduce or alter the impact of the INWE in order to reduce or mitigate the device performance problems associated therewith.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods for compensating for INWE effects and for forming isolation structures and STI trenches in a semiconductor device, which may be carried out in a variety of semiconductor manufacturing processes. In accordance with one aspect of the invention, a method is provided for forming an isolation structure. A hard mask layer is formed over isolation and active regions of a semiconductor body, and a dopant is selectively provided to a portion of the active region proximate the isolation region to create a threshold voltage compensation region. Thereafter, the hard mask layer is patterned, the patterned hard mask is used in forming a trench in the isolation region near the compensation region, and the trench is then filled with a dielectric material to create an isolation structure. The doping of the compensation region proximate the isolation structure helps to mitigate or counteract the adverse INWE effects associated with scaled active region widths, including stress effects and dopant loss effects, wherein the illustrated examples below provide for selective implantation of the compensation region without adding extra masks to a fabrication process flow.

The selective provision of dopants to the compensation region can be performed in any suitable manner prior to patterning of the hard mask layer, such as through selective implantation using a patterned resist mask. In one example, the resist mask is used for implanting the compensation region, and thereafter is used as an etch mask to pattern an opening in the hard mask layer. The patterned hard mask is then used in etching the isolation trench, where the resist mask may be removed prior to trench etching, or may remain during the trench etch. The implantation may be followed by an optional thermal anneal process, such as rapid thermal annealing (RTA), alone or in combination with a cleaning process to remove implantation residue prior to patterning the hard mask.

The following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to methods for counteracting INWE effects and forming isolation structures and trenches in semiconductor devices, in which the negative impacts of the INWE are eliminated or substantially mitigated by providing dopants to portions of the narrow active regions proximate the isolation regions, which can be accomplished without the addition of extra mask steps in a fabrication process flow. By the selective introduction of dopants into the compensation region, the methods of the invention may be advantageously employed to improve a balance or minimize an imbalance of the threshold voltage performance of NMOS and PMOS transistors, whereby stable and predictable performance of inverter circuits and SRAM memory cells can be enhanced.

In order to fully appreciate the various aspects of the present invention, a brief description of a conventional STI fabrication process will be discussed. After a discussion thereof, the various aspects of the present invention will be disclosed and fully appreciated. In the fabrication of semiconductor devices, isolation structures are formed between active areas in which electrical devices such as transistors, memory cells, or the like, are to be formed. The isolation structures, in this case shallow trench isolation (STI) structures, are typically formed during initial processing of a semiconductor substrate, prior to the formation of such electrical devices. In this regard, the invention may be employed in association with any type of beginning semiconductor body, including but not limited to silicon wafer, epitaxial silicon layers formed over an insulator in SOI wavers, etc.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. A pad oxide layer and a nitride layer are typically formed over the substrate surface and patterned to expose only the isolation regions, with the prospective active device regions covered. The nitride layer operates as a hard mask during subsequent processing steps, and the pad oxide layer functions to relieve stress between the underlying silicon substrate and the nitride layer. An anisotropic (e.g., "dry") etch is then performed to form a trench through the nitride, pad oxide, and substrate. Once the trench is etched, dielectric material is deposited to fill the trench with oxide. Thereafter, the device is commonly planarized using a chemical mechanical polishing (CMP) process and the nitride protection layer is removed.

A conventional STI process is illustrated in prior art FIGS. 6-12 to form trench isolation structures in a semiconductor device 112. In prior art FIG. 6, a thermal oxidation process is used to grow a pad oxide layer 114 over a semiconductor body 116. A nitride layer 118, such as $Si_3N_4$, is then deposited in prior art FIG. 7, such as by low-pressure chemical vapor deposition (LPCVD). The nitride layer 118 is used to protect the active regions of the semiconductor body (e.g., the substrate) 116 from adverse effects of the subsequent formation of isolation trenches between the active regions. The active regions of the device 112 are then masked in prior art FIG. 8 using a patterned etch mask 120 (e.g., a resist), leaving the isolation region of the nitride layer 118 exposed. In one conventional photoresist mask process, a dry etch 122 is performed to form a trench 124 through the nitride layer 118, the pad oxide layer 114, and into the body region 116 using the photoresist 120 as the etch mask. Alternatively, a hard mask process may be performed, wherein the photoresist 120 can be removed after patterning the hard mask 118. The patterned hard mask may then be used as the mask for patterning the trench 124. As illustrated in prior art FIG. 9, an oxide liner 126 is optionally formed in the trench 124 to remove or repair substrate damage caused by the trench etch process 122.

Figure 10:
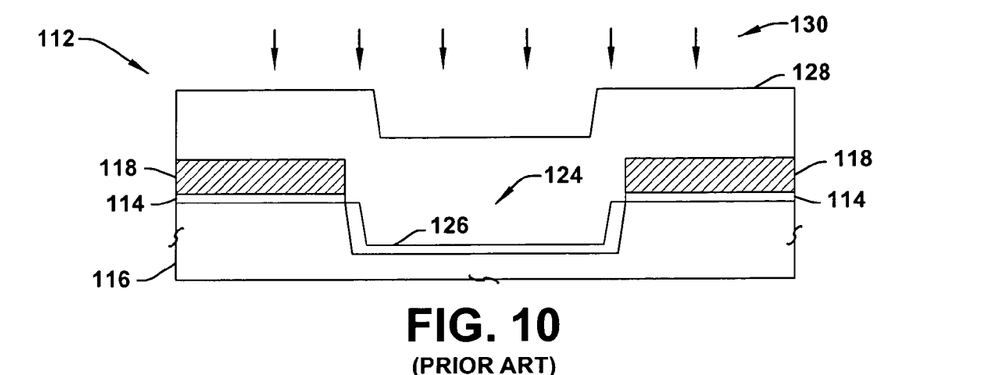
Figure 11:
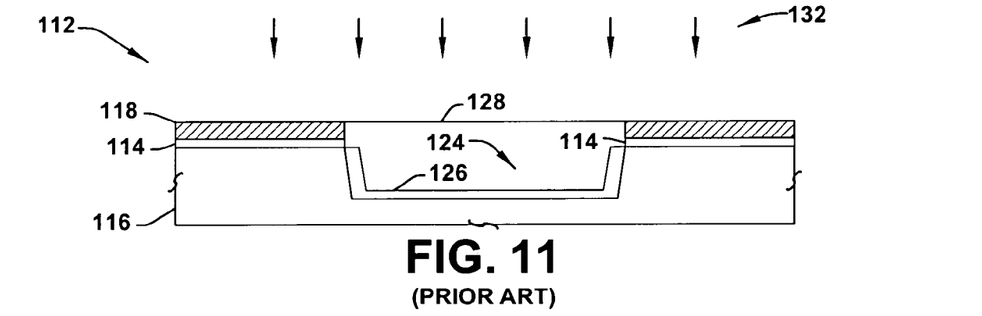
Figure 12:
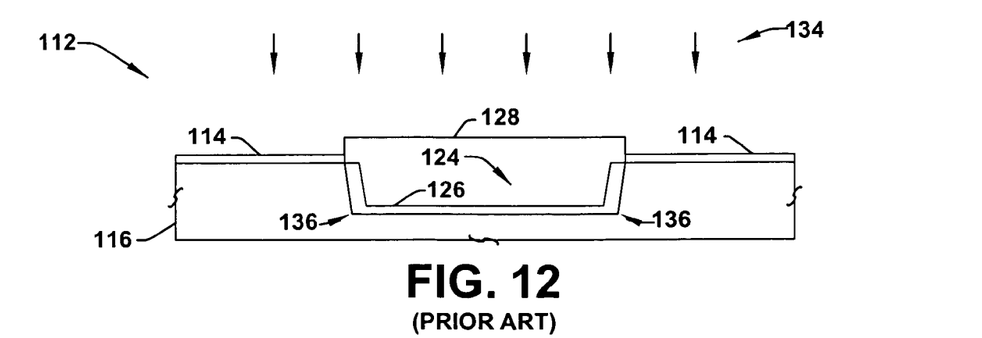

Once the trench 124 and the liner 126 are formed, a dielectric material 128 is deposited in prior art FIG. 10 via a deposition process 130 to fill the trench 124 and also to cover the nitride layer 118 in the active regions of the device 112. In prior art FIG. 11, a chemical mechanical polishing (CMP) or other planarization process 132 is used to planarize the upper surface of the device 112, which exposes the remainder of the nitride layer 118. Following planarization, the nitride layer 118 is removed via an etch process 134 in prior art FIG. 12 to complete the isolation process, leaving the STI structure 128 in the trench 124.

Figure 13:
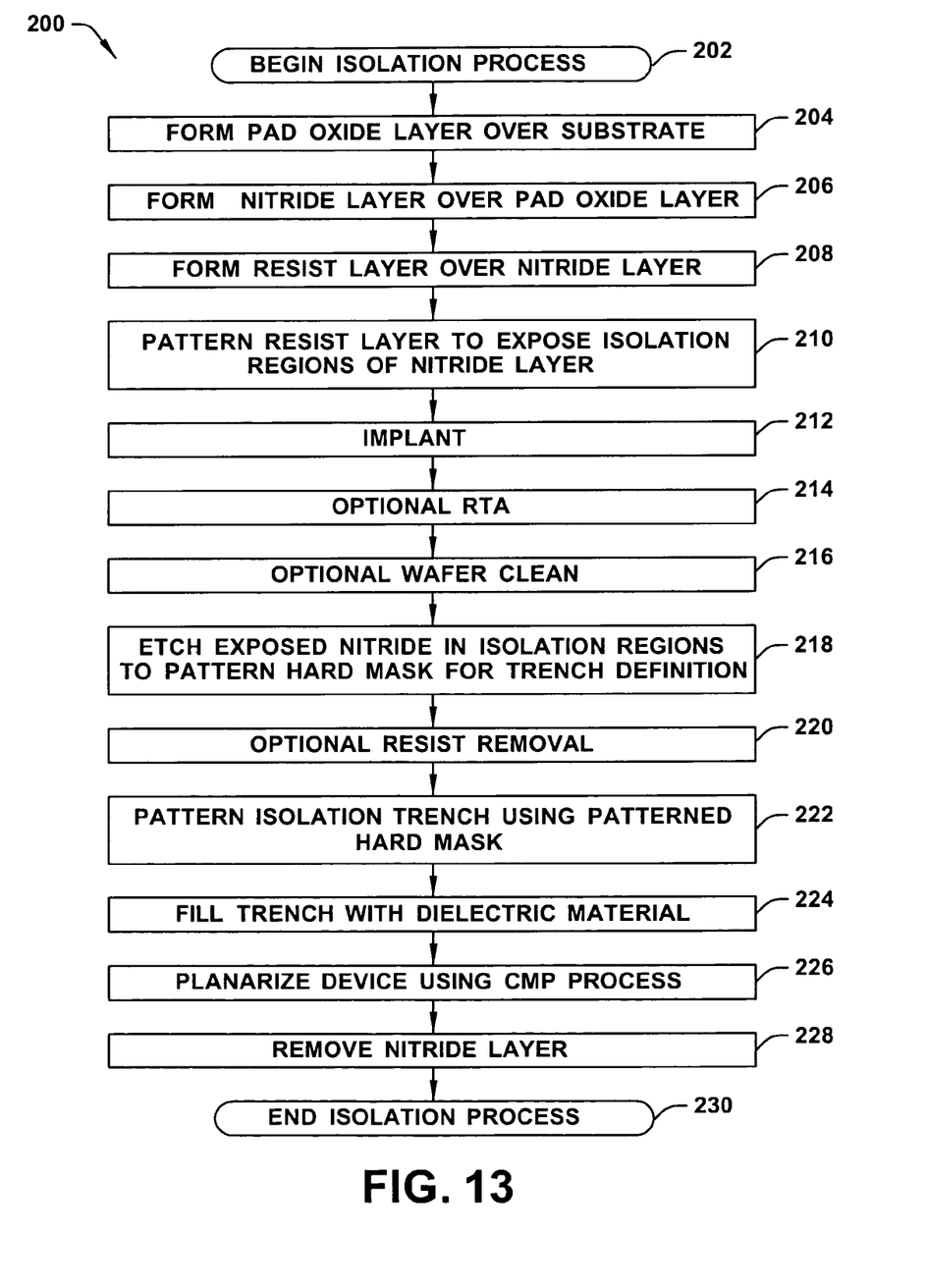
FIG. 13 is a flow chart diagram illustrating an exemplary method of forming an isolation trench in accordance with an aspect of the present invention.

Referring now to FIG. 13, an exemplary method 200 is illustrated and described for forming an isolation structure in a semiconductor device in accordance with one or more aspects of the invention. While the exemplary method 200, and other methods according to the invention, are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Beginning at 202, a pad oxide layer is formed at 204 over a semiconductor body such as the substrate, and a nitride layer is formed at 206 over the pad oxide layer. The pad oxide layer may be formed at 204 using any appropriate oxidation process, such as a thermal oxidation growth or a deposition process, to form any type of oxide material to any suitable thickness, such as about 100 Å in one example. The pad oxide layer may function to relieve stress between the underlying silicon substrate and the overlying nitride layer formed at 206, and/or to serve as an etch stop when removing the nitride layer later in the process, wherein the nitride layer operates as a hard mask in subsequent isolation processing, for example, to protect the underlying active regions of the substrate. The nitride layer may be formed at 206 using any appropriate deposition techniques and materials, such as $Si_3N_4$ deposited by low pressure chemical vapor deposition (LPCVD), to form a nitride hard mask material of any suitable thickness, such as about 1000 Å in one example.

A resist layer is formed over the nitride layer at 208, and then patterned at 210, to form a patterned resist mask that has an opening exposing portions of the nitride above the isolation regions of the semiconductor body, while covering active regions thereof. The patterning of the resist mask at 210 may be accomplished according to any suitable patterning techniques including photolithographic methods, such as by exposing select portions of the resist to a radiation source through a photomask, and removing either the exposed or the unexposed portions of the resist material (depending on the resist type) so as to expose a portion of the nitride layer above the isolation regions and to leave the active regions covered with the nitride layer.

In accordance with an aspect of the present invention, dopants are selectively provided to create threshold voltage compensation regions in portions of the active regions of the semiconductor body alongside or proximate the isolation regions, so as to counteract or compensate for stress and dopant loss effects associated with STI isolation structures (e.g., to combat INWE effects). In the exemplary method 200, a blanket dopant implant is performed at 212, with the patterned resist mask in place, and before the nitride hard mask is patterned. This creates a doped compensation region at the upper portions of the isolation regions, which extends laterally into portions of the adjacent active regions. At 214, and optional rapid thermal anneal process may be performed to further drive the implanted compensation region dopants deeper and further laterally into the active regions. An optional wafer clean operation may then be undertaken at 216 to remove any residue introduced onto the wafer during the implantation at 212 prior to hardmask patterning and trench formation below.

Any suitable implantation may be performed at 212, where the patterned resist mask advantageously operates to allow dopants to enter the upper isolation region and the compensation region portions of the adjacent active regions, while preventing or inhibiting implantation in the remainder of the active regions. It is noted that the exemplary implementation allows selective dopant provision to create the compensation regions without adding extra masking steps to the fabrication process flow, although alternative implementations are possible wherein dopants are provided using other selective doping techniques, possible using extra masks at other points in the process prior to hard mask patterning, wherein all such alternative implementations are contemplated as falling within the scope of the invention and the appended claims.

Moreover, the implantation at 212 may be an angled implant or a non-angled implant. In either case, straggle effects allow provision of dopants into the select portions of the active regions, with or without the optional annealing at 214, to create the compensation regions that are not removed in subsequent isolation trench formation. In one possible example, the implant at 212 can be an angled implant, wherein the width of the resulting compensation regions is greater than a width of the isolation regions, as may be appreciated. Such an angled implant may be a quad angled implant using any suitable implant angle, wherein a total implant dose is divided into four implants, wherein each implant is performed at substantially the same angle with the wafer being rotated 90 degrees after each implant. Alternatively, other type angled or non-angled implants may be employed and are contemplated as falling within the scope of the present invention, wherein dopants are provided into the semiconductor body at least in regions of the semiconductor body that will extend laterally beyond the subsequently formed trench (e.g., active regions), as initially implanted at 212 and/or following an optional anneal at 214.

The implant at 212 is used to provide any type of dopant to create the compensation regions of the invention. For example, n-type dopants, such as arsenic (As) or phosphorus (P) may be implanted at 212 to counteract situations in which INWE effects cause a reduction in PMOS threshold voltages and an increase in NMOS threshold voltages. While any n-type dopant may be employed and is contemplated by the present invention, the n-type dopant preferably is As since As tends to diffuse less than phosphorous. In other situations, p-type dopants may be implanted at 212, wherein all such alternative implementations are contemplated as falling within the scope of the invention. The exemplary implantation at 212 is a blanket implant, with the patterned resist mask operating to selectively allow dopant introduction into the isolation regions and the threshold voltage compensation regions (in the border portions of both NMOS and PMOS active regions), while inhibiting dopant introduction elsewhere. In one exemplary implementation, arsenic is implanted at 212 using an energy of about 100 KeV or more and about 300 KeV or less with a dose of about 5E12-2E13, where the implanted depth of the compensation region is greater than about 1000 Å, such as about 1000 Å or more and about 1500 Å or less.

In another possible implementation, phosphorus is implanted at 212 at an energy of about 50 KeV or more and about 150 KeV or less, at a dose of about 5E12-2E13. In these examples, the lateral extension of the compensation regions dopants (e.g., straggle) into the active regions of the semiconductor body is about 50 Å or more and about 500 Å or less for a transistor width of about 1500 Å. The optional annealing may be performed at 214 for about 1 second or more and about 3 seconds or less at a temperature of about 900 degrees C. or more and about 1000 degrees C. or less, by which the lateral extent of the compensation regions may be increased by about 100 Å. As may be appreciated, the implant energy maybe increase or decreased as needed, according to the lateral dimensions of the opening in the patterned resist mask (e.g., the isolation region width) and/or according to the thicknesses of the pad oxide and nitride hard mask layers formed at 204 and 206, respectively.

At 218, the exposed portions of the nitride and pad oxide hard mask layers are patterned, for example, with a anisotropic, dry etch to form openings over the isolation regions of the semiconductor body. Following patterning of the hard mask at 218, the patterned resist may be removed, for example, by ashing at 220, or alternatively, the resist may remain through the subsequent trench etching operation. At 222, an isolation trench is patterned, for example, by dry etching using the patterned nitride hard mask (along with the resist mask if the optional resist removal at 220 is omitted). The trench etch at 222 may be carried out using known trench etching techniques, such as reactive ion etching (RIE), wherein the patterned hard mask and/or any remaining resist operate as an etch mask. For example, a single or multi-step RIE etch process may be performed which removes material in the exposed isolation regions so as to etch through any remaining nitride or oxide associated with the hard mask and pad oxide, and etch into the semiconductor substrate so as to form a trench having sidewalls, and a bottom. Any suitable trench width and depth dimensions may result, wherein the trench width is designed according to the isolation region width and the depth may be any value that is deeper than the depth of the threshold voltage compensation regions, such as about 3500 Å in one example. Since the width of the threshold voltage compensation region is greater than a width of the trench, and since a depth of the trench is greater than that of the compensation regions, the trench formation breaks the compensation region into compensation sub-regions that surround one or more upper portions of the sidewalls of the trench.

At 224, the trench is filled with dielectric material such as $SiO_2$ or other electrically isolating material so as to provide electrical isolation between active regions on either side of the isolation trench. The trench filling operation at 224 may comprise forming or depositing dielectric material over the device to cover the nitride hard mask layer in the active regions and to fill the trenches in the isolation regions thereof. The trench fill material may be deposited at 224 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS). The device is then planarized at 226 to expose a portion of the nitride hard mask layer in the active regions, leaving a generally planar upper surface with portions of the nitride layer and a remaining portion of the fill material in the trench exposed. The remaining nitride material is stripped or removed at 228, for example, using a wet etch process selective so as to remove nitride material and to stop on the pad oxide layer without damaging the underlying silicon or other semiconductor material in the active regions of the device. The isolation method 200 then ends at 230. Thereafter, transistors, memory cells, and/or other electrical devices may be formed in the active regions using semiconductor processing techniques as are known.

During such formation of transistors in the active regions, the compensation sub-regions formed along top sidewall portions of the isolation trenches serve to alter an impact of the inverse narrow width effect (INWE) by providing the compensation dopant to account for or adjust dopant loss to the STI trench. For example, in the PMOS regions, an n-type compensation region adds to subsequently added n-type dopant in the PMOS active regions (e.g., due to formation of an N-well therein); and consequently any dopant loss from the region close to the STI trench is compensated by the compensation sub-regions so that the n-type dopant in the PMOS active region is more uniform. Accordingly, the threshold voltage of the resulting PMOS transistors increases despite the INWE effect. Consequently, the PMOS threshold voltages for narrow width devices may be increased, for example by about 10%. In one example, the threshold voltage was increased from about negative 0.3V to about negative 0.33V.

Conversely, in the NMOS regions, the n-type compensation regions provide for a net reduction in the charge associated with the p-type dopant in the NMOS regions (e.g., due to the p-type substrate or due to a p-type well region), thus causing a dopant loss to the STI trench to be exaggerated or increased. Thus the NMOS regions will experience increased dopant loss, thereby causing a decrease in the threshold voltage of NMOS transistors therein. In one example, the NMOS threshold voltages were decreased about 10%, from about 0.5V to about 0.45V. In the above manner, "cold" transistors are made more "warm", and "hot"

transistors are made more "cool", such that the threshold voltage differences between the PMOS and NMOS devices may be decreased. Therefore the present invention provides another control knob for altering the threshold voltage of NMOS and PMOS transistors without an additional mask step. While in the above example, an n-type dopant such as arsenic is employed in the implant to alter the threshold voltages as described, alternatively, the compensation implant may comprise a p-type dopant, wherein such dopant serves to adjust the threshold voltages of the PMOS and NMOS devices in the opposite directions. Such alternatives are contemplated as falling within the scope of the present invention and the appended claims.

Referring now to FIGS. 14-24, one exemplary implementation of the techniques provided by the exemplary method 200 of FIG. 13 is illustrated, wherein a semiconductor wafer or device 302 is processed to form isolation structures therein. It is noted at this point that the illustrations provided herein are not necessarily drawn to scale, and that the above method 200 may be employed in processing structures other than those illustrated in the following figures, and further that the structures illustrated and described herein may be fabricated according to other techniques.

Figure 14:
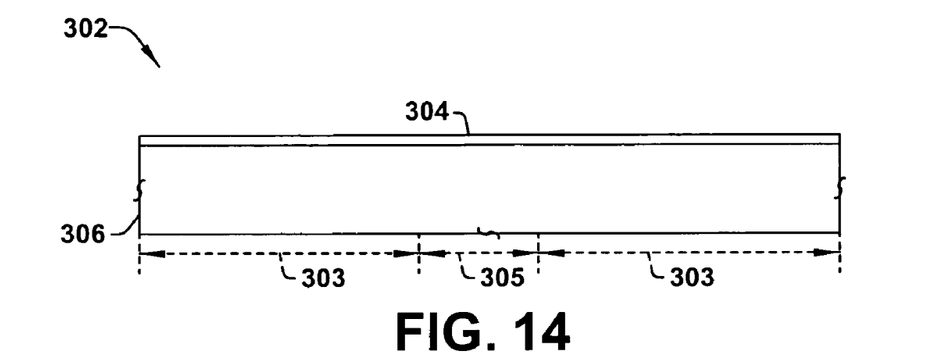
FIG. 14 is a partial side elevation view in section illustrating a pad oxide layer being formed over a semiconductor body in the fabrication of a trench isolation structure according to the invention.
Figure 15:
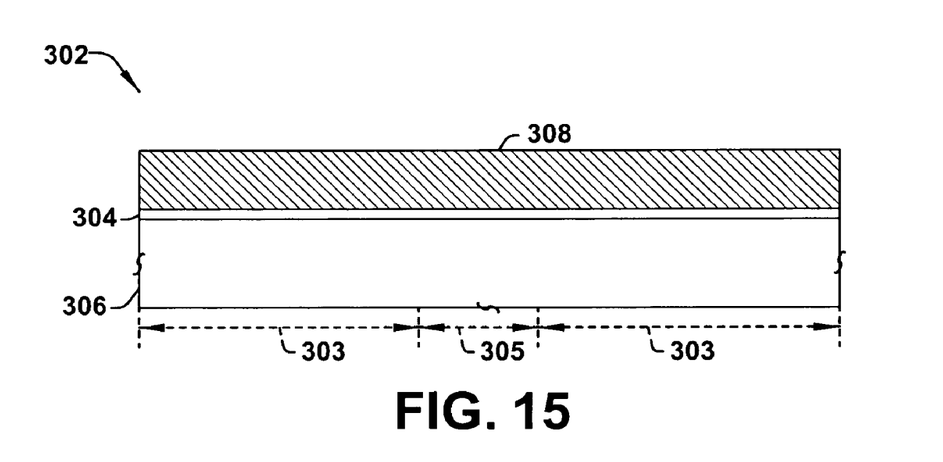
FIG. 15 is a partial side elevation view in section illustrating formation of a nitride hard mask layer over the pad oxide layer of FIG. 14.

In FIG. 14, the wafer 302 is illustrated comprising a semiconductor body (e.g., a substrate) 306, such as silicon having prospective active regions 303 (e.g., PMOS or NMOS regions) in which electrical devices are to be subsequently fabricated, as well as a prospective isolation region 305 in which an isolation structure is to be formed to isolate the active regions 303 from one another. An oxidation process (not shown) is initially employed to grow a pad oxide layer 304 over the top surface of the substrate 306 as illustrated in FIG. 14. A nitride hard mask layer 308 is then deposited in FIG. 15, such as by low pressure chemical vapor deposition (LPCVD) of $Si_3N_4$ or equivalent nitride or equivalent material.

Figure 16:
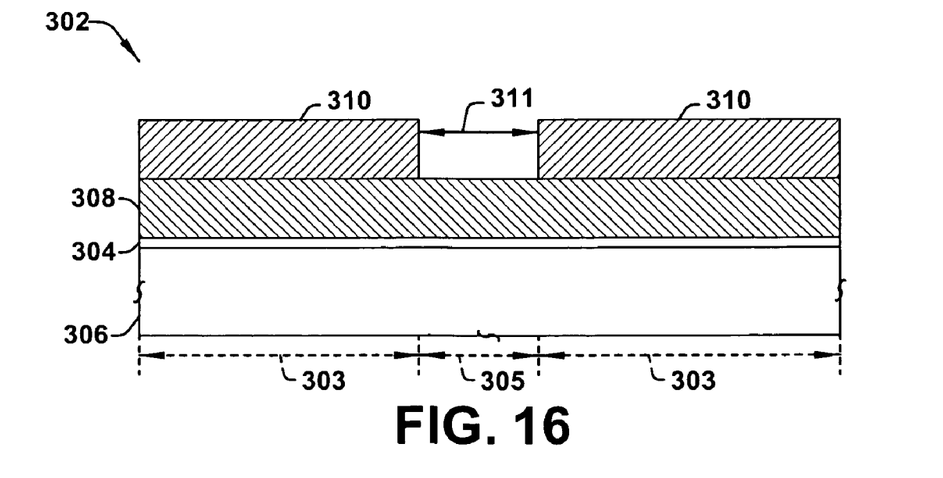
FIG. 16 is a partial side elevation view in section illustrating a patterned resist mask formed over the nitride hard mask layer having an opening exposing a portion of the hard mask layer in an isolation region in the device of FIGS. 14 and 15.
Figure 17:
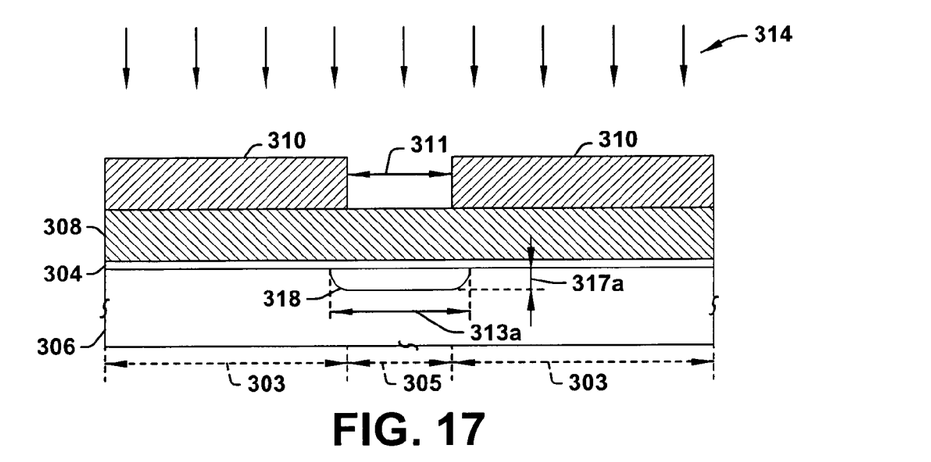
FIG. 17 is a partial side elevation view in section illustrating implantation of a dopant through the opening in the patterned resist mask to create a threshold voltage compensation region in a portion of the active region adjacent the isolation region in the device of FIGS. 14-16.
Figure 18:
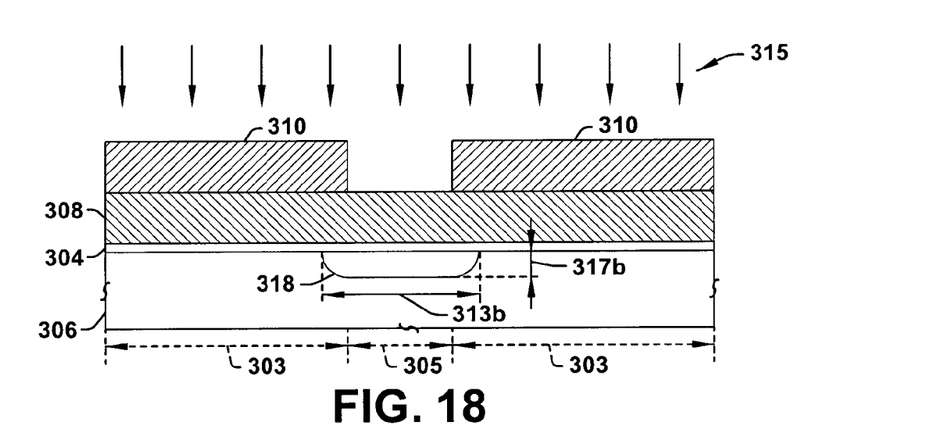
FIG. 18 is a partial side elevation view in section illustrating an optional rapid thermal anneal process extending the width and depth of the implanted compensation region in the device of FIGS. 14-17.

Thereafter, in FIG. 16, a patterned mask 310 (e.g., a developed photoresist) is formed to cover the active regions 303 while exposing the nitride hard mask layer 308 in the isolation region 305 for subsequent trench formation therein. As illustrated in FIG. 16, the patterned resist mask 310 includes an opening having a lateral width 311 corresponding to the width of the isolation region 305. In FIG. 17, with the patterned resist mask 310 in place, a blanket ion implantation process 314 is performed to selectively provide a dopant through the opening of the patterned resist mask 310 to create a threshold voltage compensation region 318 prior to the nitride layer 308 being patterned, where the dopant may be n-type or p-type. In one implementation, n-type dopants (e.g., As, P, etc.) are implanted via the process 314, where the patterned resist mask 310 operates to allow dopant introduction into the compensation region 318, while inhibiting dopant introduction elsewhere.

In the illustrated implementation, the process 314 provides arsenic implantation at an energy of about 100 KeV or more and about 300 KeV or less with a dose of about 5E12-2E13, where an implanted depth 317a of the compensation region is about 1000 Å or more, and the width 313a is about 100-1000 Å greater than the width 311 of the resist mask opening (e.g., the compensation region 318 extends laterally into the active regions 303 by about 50-500 Å on either side of the isolation region). In another possible implementation, phosphorus is implanted at an energy of about 50 KeV or more and about 150 KeV or less, at a dose of about 5E12-2E13. An optional RTA process 315 is then performed in FIG. 18 for a duration of about 1-3 seconds at a temperature of about 900-1000 degrees C., by which the lateral extent of the compensation regions (e.g., the width 313b in FIG. 18) is increased by about 100 Å, and the depth 317b of the compensation region 318 also increases to about 1000-1500 Å.

Figure 19:
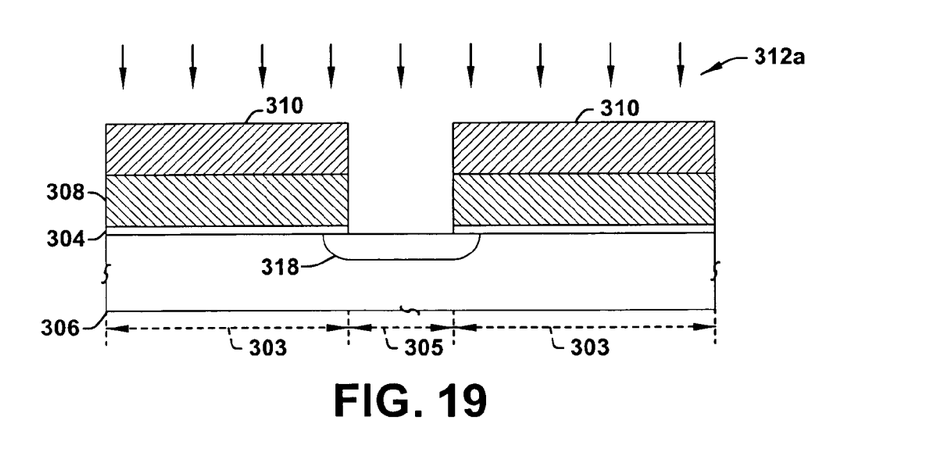
FIG. 19 is a partial side elevation view in section illustrating a dry etch process for patterning all or a portion of the nitride hard mask using the patterned resist mask to form an opening through the hard mask that exposes a portion of the isolation region in the device of FIGS. 14-18.
Figure 20:
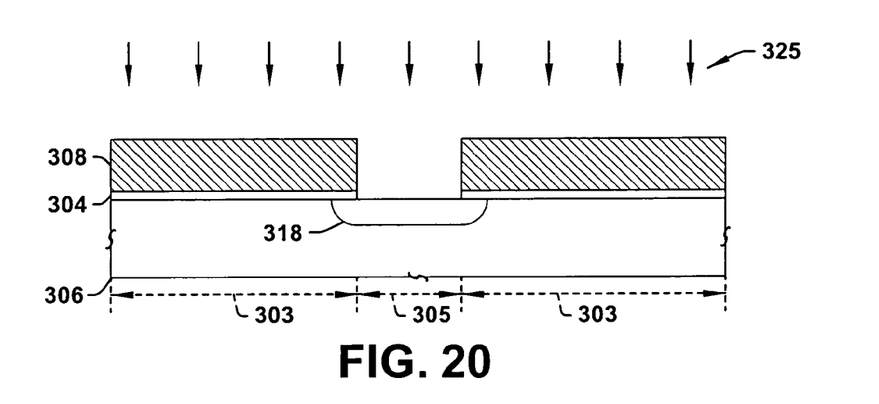
FIG. 20 is a partial side elevation view in section illustrating an optional resist ashing operation to remove the resist mask after patterning the hard mask in the device of FIGS. 14-19.

In FIG. 19, a dry etch process 312a is employed to etch through the nitride hard mask layer 308 and at least a portion of the pad oxide layer 304 to substantially expose the semiconductor body associated with the isolation region 305, thereby creating a patterned hard mask 304, 308. Various alternatives may be employed, including etching nitride 308 only and stopping on the pad oxide 304, etching the nitride 308 and a portion of the oxide 304, or etching both the nitride 308 and the oxide 304 and stopping on the silicon semiconductor body 306. Thereafter in FIG. 20, the resist mask 310 is removed via a resist ash process 325. Alternatively, the resist ash process 325 may be omitted, with the resist mask 310 remaining during subsequent trench etching.

Figure 21:
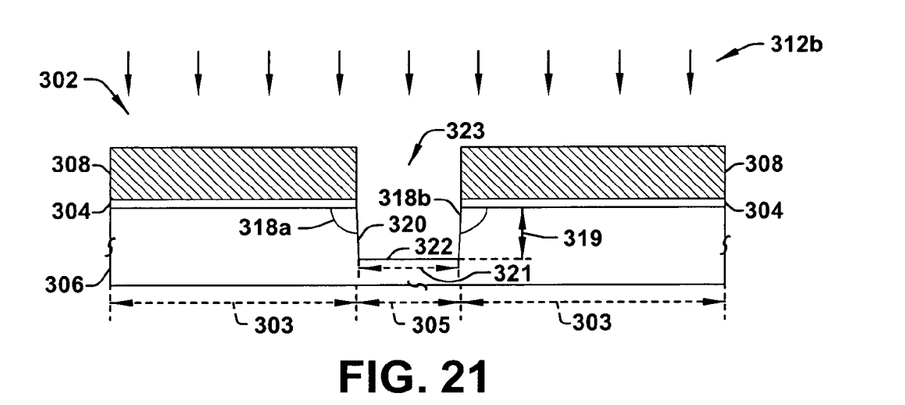
FIG. 21 is a partial side elevation view in section illustrating the formation of a trench in the isolation region of the semiconductor body, wherein the threshold adjustment regions reside alongside upper portions of the trench sidewalls in the device of FIGS. 14-20.

In FIG. 21, an etch process 312b is performed using the patterned hard mask 304, 308 to form an isolation trench 323 to a depth 319 that is greater than the depth 317b (FIG. 18) of the compensation regions 318 (e.g., the trench depth 319 is about 3500 Å in one example), wherein the trench 323 comprises sidewalls 320 and a bottom 322. Because the trench depth 319 is greater than the compensation region depth, the trench etch process 312b effectively separates the region 318 into compensation sub-regions 318a and 318b that reside along upper portions of the trench sidewalls 320. Although the FIG. 21 shows the trench splitting the compensation region 318 into discrete regions, it should be understood that the compensation sub-regions 318a and 318b may be generally continuous peripheral regions that run along a peripheral sidewall of a trench, and in the instance of an island-shaped trench, the compensation sub-region(s) may encircle the trench 323 in a substantially continuous manner. Alternatively, for island shaped active regions 303, a single compensation region 318 will encircle the upper portions of the laterally outer surfaces thereof. Once the trench formation etch 312b is complete, a liner (not shown) may optionally be formed in the trench 323, such as through oxidation of the exposed portions of the trench 323 using a thermal growth process.

Figure 22:
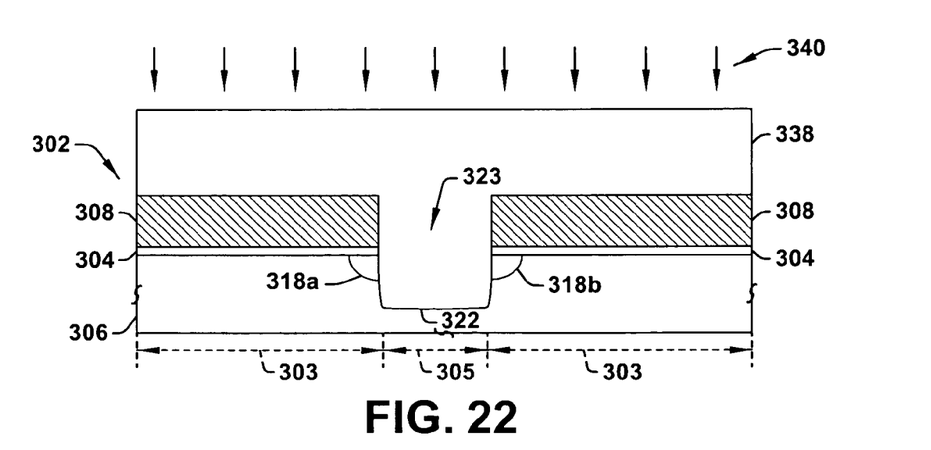
FIG. 22 is a partial side elevation view in section illustrating deposition of dielectric trench fill material into the trench and over the upper portions of the device of FIGS. 14-21.

In FIG. 22, the trench 323 is then filled in with electrically isolating material 338 (e.g., a dielectric) via a deposition process 340, for example. The process 340 may involve any appropriate deposition methodologies as are known, such as depositing $SiO_2$ or other isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials and deposition processes are contemplated as falling within the scope of the appended claims.

Figure 23:
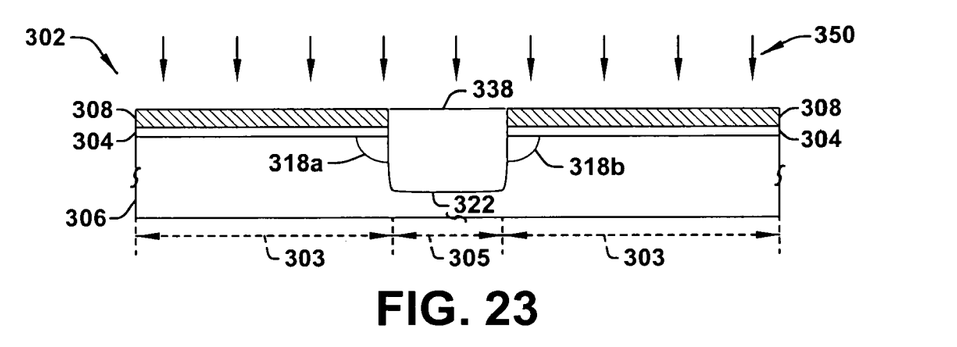
FIG. 23 is a partial side elevation view in section illustrating planarization of the device of FIGS. 14-22 using a CMP process.
Figure 24:
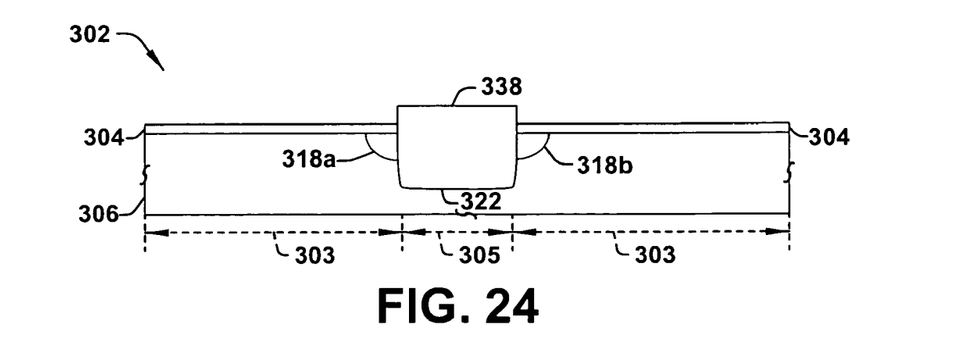
FIG. 24 is a partial side elevation view in section illustrating removal of the nitride hard mask from the device of FIGS. 14-23.

Thereafter in FIG. 23, a planarization process 350 is performed to remove the upper portions of the fill material 338 as well as upper portions of the nitride hard mask layer 308, wherein the nitride layer 308 serves as a planarization stop. The planarization process 350 may be a chemical-mechanical polishing (CMP) process wherein a generally planar upper surface is provided in the device 302. Subsequently in FIG. 24, the remainder of the nitride layer material 308 is stripped or otherwise removed, leaving a finished STI isolation structure comprising the trench 323 filled with dielectric material 338 proximate the exemplary threshold voltage compensation sub-regions 318a and 318b along upper sidewall portions of the trench 323. Thereafter, transistors, memory cells, and/or other electrical devices (not shown) may be formed in the active regions using semiconductor processing techniques as are known.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming an isolation structure, comprising:

forming a hard mask layer over isolation and active regions of a semiconductor body, the hard mask layer being separate from a pad oxide layer;

forming a patterned resist mask over the hard mask layer, the patterned resist mask having an opening exposing a portion of the hard mask layer above the isolation region selectively providing a dopant to a portion of the active region proximate the isolation region by implanting the dopant through said opening in said patterned resist mask to create a threshold voltage compensation region;

patterning the hard mask layer by etching an exposed portion of the hard mask layer through the opening of patterned resist, thereby creating the pattenerned hard mask having an opening that exposes a portion of the semiconductor body in the isolation region after creating the threshold voltage compensation region;

forming a trench in the isolation region near the threshold voltage compensation region after creating the patterned hard mask; and filling the trench with a dielectric material by depositing an oxide material in the trench, and planarizing the oxide material to form an isolation structure using the hard mask as a planarization stop.

2. The method of claim 1, wherein providing a dopant to a portion of the active region further comprises performing a rapid thermal annealing process after implanting the dopant and before patterning the hard mask layer.

3. The method of claim 2, wherein the rapid thermal annealing process is performed at a temperature of about 900 degrees C. or more and about 1000 degrees C. or less for about 1 second or more and about 3 seconds or less.

4. The method of claim 1, wherein providing a dopant to a portion of the active region further comprises performing a wafer clean operation after implanting the dopant and before patterning the hard mask layer.

5. The method of claim 1, wherein forming the hard mask layer comprises:

forming the pad oxide layer over the semiconductor body; and forming a nitride hard mask layer over the pad oxide layer.

6. The method of claim 1, wherein the dopant comprises arsenic or phosphorous.

* * * * *